United States Patent
Tung et al.

[11] Patent Number: 5,254,501
[45] Date of Patent: Oct. 19, 1993

[54] SAME-SIDE GATED PROCESS FOR ENCAPSULATING SEMICONDUCTOR DEVICES

[75] Inventors: Richard K. Tung, Cupertino; Joel J. Camarda, San Francisco, both of Calif.

[73] Assignee: Cypress Semiconductor Corporation, San Jose, Calif.

[21] Appl. No.: 942,892

[22] Filed: Sep. 11, 1992

[51] Int. Cl.⁵ ............................................. H01L 21/60
[52] U.S. Cl. ................................. 437/214; 437/211; 437/212; 437/219; 264/328.12; 264/272.17
[58] Field of Search .............. 437/211, 212, 213, 214, 437/219, 216; 264/328.1, 328.12, 272.17

[56] References Cited

U.S. PATENT DOCUMENTS

| | | | |
|---|---|---|---|
| 4,812,420 | 3/1989 | Matsuda et al. | 437/214 |
| 4,900,501 | 2/1990 | Saeki et al. | 264/272.17 |
| 4,954,308 | 9/1990 | Yabe et al. | 264/328.12 |
| 5,013,688 | 5/1991 | Yamazaki et al. | 437/211 |
| 5,077,237 | 12/1991 | Hara | 437/214 |
| 5,096,853 | 3/1992 | Yasunaga et al. | 437/211 |
| 5,133,921 | 7/1992 | Yokoyama | 264/272.17 |
| 5,182,071 | 1/1993 | Knapp et al. | 264/328.12 |
| 5,200,366 | 4/1993 | Yamada et al. | 437/211 |

Primary Examiner—Brian E. Hearn
Assistant Examiner—Kevin M. Picardat
Attorney, Agent, or Firm—Kenyon & Kenyon

[57] ABSTRACT

A transfer molding process for encapsulating a semiconductor device, such as an integrated circuit, in plastic. The semiconductor device is mounted on and electrically connected to a leadframe, the leadframe is placed in a preheated mold with the device and electrical connections disposed in a cavity and preheated thermosetting plastic molding compound is injected into the cavity through a gate located on the same side of the mold cavity as the device and electrical connections.

9 Claims, 4 Drawing Sheets

SAME-SIDE GATED PROCESS FOR ENCAPSULATING SEMICONDUCTOR DEVICES

FIELD OF THE INVENTION

The present invention relates to a process for encapsulating delicate semiconductor devices, such as integrated circuits, in plastic.

BACKGROUND OF THE INVENTION

Transfer molding refers to molding with thermosetting plastic materials, referred to as molding compounds, in which the plastic is softened by heat and pressure in a transfer chamber, then forced at high pressure through suitable sprues, runners, and gates into a closed mold for final curing. Transfer molding was invented in the 1920's by the Shaw Company. By the 1950's transfer molding had become generally utilized in the encapsulation of electronic devices such as diodes, rectifiers and switches in plastic. By the early 1960's transfer molding was utilized to encapsulate semiconductor devices such as transistors.

U.S. Pat. No. 3,367,025 to Doyle, describes a method for encapsulating a semiconductor device in plastic by transfer molding. The particular semiconductor device disclosed is a planar transistor. In the method disclosed in the '025 patent the planar transistor device is mounted on a flattened portion of the base lead. Electrical connections are made between the device and the emitter and collector leads of the finished transistor using extremely fine gold wire, typically between 3-5 mils in diameter. The three leads are then held by a portion of a molding jig that also places the device and electrical connections in the interior of a mold cavity. Plastic is injected into the mold cavity through a gate located in the top half of the mold cavity, but beneath the device and the electrical connections, to encapsulate the device.

U.S. Pat. No. 3,439,238 to Birchler et al. also discloses a process for encapsulating a transistor in plastic. In the method disclosed in the '238 patent transistor leads are disposed at the parting line of the two halves of a mold cavity with the transistor device and the electrical connections being disposed in the top half of the cavity. To encapsulate the device, plastic is injected through a gate located in the bottom half of the mold cavity, i.e. on the opposite side of the mold cavity from the device and electrical connections. The transistor is held firmly in place by supporting it on a conductor held at both ends. The '238 patent discloses that locating the gate on the opposite side of the mold cavity from the device and whisker wire connections helps to prevent direct contact between the injected plastic and the device and wires. According to the patent, the avoidance of avoid direct contact helps to prevent the plastic from dislodging or breaking the electrical connections. Injecting the plastic into the bottom half of the mold cavity also allows the mold to be more easily cleaned as the hardened plastic around the gate, and the runner system of the mold, can be easily seen by the mold operator. Additionally, upon lifting the top half of the mold the device may be viewed. Two additional related patents, U.S. Pat. Nos. 4,043,027 and 3,716,764, were issued based on the same disclosure as the '238 patent.

Today, transfer and injection molding are widely utilized to encapsulate electronic components, particularly semiconductor devices, in plastic. In generally utilized processes, a semiconductor die, generally an integrated circuit wafer, is mounted on a leadframe. Electrical connections are made from terminals on the die to leads on the leadframe to provide external connections for the encapsulated device. The electrical connections usually comprise 1-3 mil in diameter gold wires which are connected to the device and the leadframe in an automated wire bonding process. The electrical connections are sometimes referred to as bond wires, or whisker wires.

After the electrical connections have been made, the leadframe, which may contain many active elements, is placed in a recess in one half of a two part separable mold. Each half of the mold has a stiff backplate which is mounted on a platen of a hydraulic or mechanical press. The mating surfaces of the mold are often referred to as the parting line.

For insertion of the leadframe the two halves of the mold are held apart. The mold press is then activated to close the two mold halves together at the parting line, forming a cavity around each semiconductor die. The separable mold halves press tightly against the leadframe around the perimeter of each cavity in order to seal each cavity. Runners and channels connect each cavity to one or more central reservoirs or pots in which plastic is placed. The plastic may be preheated in the reservoir or pot to soften the plastic. A hydraulically or mechanically driven ram compresses the plastic in the reservoir or pot so that it flows through the channels and runners to each mold cavity. The plastic proceeds to enter the mold cavity where it hardens to encapsulate the device and electrical connections. Typically a thermosetting plastic is utilized. Various types of thermosetting plastics are well known to those skilled in the art.

In order to push liquified plastic from the reservoir(s) into the mold cavities it is frequently necessary to inject or transfer the plastic at pressure exceeding 1000 pounds per square inch. The point at which plastic enters each mold cavity is generally referred to as the gate. The transfer pressures utilized cause the heated plastic to enter the cavity at high velocity. The result is a region of high velocity plastic flow near the gate that dissipates as the plastic moves into the cavity and assumes a plug flow configuration.

The shape of the mold cavity, and the configuration of the leadframe, will determine the shape of the final plastic package. Commonly utilized plastic package types include: the PDIP (plastic dual in line package), the PLCC (the plastic leaded chip carrier), the PQFP (plastic quad flat pack), the SOIC (small outline integrated circuit) and the SOJ (small outline J lead). These packages are generally produced to meet JEDEC size and outline specifications.

Although this type of a molding process works reasonably well, some shortcomings do exist. As an example, during encapsulation the encapsulating material can cause the thin connecting wires on the semiconductor device to be dislodged and/or to move into contact with one another. These conditions are generally collectively referred to as wire sweep. It appears that wire sweep may result from the failure of the encapsulating material to be at the proper temperature during the molding operation. This causes the plastic to be insufficiently fluidized during injection into the cavity. Injecting the plastic under too high a pressure, or too great a flow rate, may also cause wire sweep. Thus, in encapsulation processes generally utilized today, the temperature of the mold and the pressure and transfer speed at which the plastic is introduced are carefully controlled. It is also recognized that the size and shape of the runners and gates in the mold also affect the pressure and rate at which the plastic enters the individual mold cavities.

Another problem with generally utilized molds and molding processes is the occurrence of flash. Flash refers plastic, typically in the shape of thin sheets or webs, which forms between the mold halves or mold parts, and/or on the leads in locations where no plastic is desired. Flash is undesirable since additional effort must be expended to remove it from the leadframes after molding and to clean away fragments which may have stuck to the mold or dropped onto the mold during unloading of the leadframes. If the flash is not removed from the mold prior to the next shot, then hardened flash may cause coining of the mold and shorten its working life. The problem of flash is most troublesome in the portions of the mold surrounding the leadframe regions, including the sealing surfaces and various edges, as well as near the gate.

Still another problem in molding processes is the occurrence of voids in the encapsulating material itself, thereby not providing ideal encapsulation. Voids can refer both to holes in the hardened plastic package, or an incomplete package. It is believed that the voids are sometimes caused by the lack of fluidization of the encapsulating material, or by a chase or runner jamming mechanism which occurs when the encapsulating material starts to solidify before it reaches the mold cavity. As additional encapsulating material is forced down the runners the partially solidified material enters the cavity but fails to completely fill the cavity.

In generally utilized processes, the semiconductor device and electrical connections between the device and the leadframe are located in the top half of the mold and the gate is located in the bottom half of the mold. This configuration has been referred to as opposite-side gating. More generally, opposite-side gated process is used to refer to a process wherein the gate in the mold is located on the opposite side of the leadframe from the device and electrical connections. Thus, if during molding the gate is located in the top half of the mold, above the leadframe, in an opposite-side gated process, the device and electrical connections are located in the bottom half of the mold, below the leadframe.

For a variety of reasons it may be desirable to transfer mold utilizing a process wherein the gate is located on the same side of the leadframe in the mold as the semiconductor device and the electrical connections. This type of process is referred to as a same-side gated process. If the gate is located in the top half of the mold cavity above the leadframe, the device and electrical connections are also located in the top half of the mold cavity above the leadframe. Similarly, if the gate is located below the leadframe in the bottom half of the mold cavity, the device and electrical connections are also located below the leadframe.

For many package types, in a same-side gated process the electrical connections between the device and the leadframe are located closer to the gate then they would be in an opposite-side gated process. The closeness of the gate to the electrical connections can result in severe wire sweep problems. Conceptually, the technique for solving the wire sweep problem would be to fill the cavity as slow as possible, i.e. reduce the velocity of the injected plastic, to avoid disturbing the electrical connections. However, slower transfer times may cause polymerization or gelling of the plastic mold compound prior to its completely filling the mold cavities. This would manifest itself as voids in the packages. Additionally, slower transfer times might also lead to wire sweep problems as the thickening plastic could dislodge electrical connections.

We have discovered a same-side gated process for encapsulating semiconductor devices that overcomes these problems.

SUMMARY OF THE INVENTION

The process of the present invention comprises encapsulating a semiconductor or integrated circuit device attached to a leadframe in a transfer mold press wherein:

the gate through which the encapsulating plastic is injected into the mold cavity containing the device is located in the same half of the mold cavity as the device and is at least 2 mm in width by at least 0.30 mm in height or depth;

the velocity of encapsulating plastic moving through the mold is between 2.0 and 4.0 mm/sec.;

and the loop height of the electrical connections between the device and the leadframe is less than 12 mils.

In the process of the present invention the velocity of the encapsulating plastic moving through the mold is controlled, by controlling the temperature of the mold press, preheating the leadframe holding the device, preheating the encapsulating plastic by preheating the transfer pot and transfer ram and controlling the pressure and velocity of the transfer ram.

According to the process of the present invention a semiconductor device, such as an integrated circuit, is encapsulated in a conventional transfer mold press including a transfer pot, channels and runners from the transfer pot to a plurality of mold cavities and a transfer ram to exert pressure on a molding compound placed in the transfer pot to force the compound from the pot, through the channels and runners into the plurality of mold cavities. For encapsulation the semiconductor device is attached to the central portion of a leadframe and electrical connections, also referred to as wire bonds, are made between the device and the leads of the leadframe. The loop height of the electrical connections is below 12 mils. Preferably, the leadframe is preheated to 188°±10° C. The leadframe with the attached device and electrical connections is placed in a mold maintained at a temperature of 188°±3° C., on a conventional mold press, with the device and electrical connections positioned in a mold cavity. Preheated thermosetting molding compound is forced from the transfer pot through the channels and runners by a transfer ram exerting a pressure of between 950 and 1050 pounds per square inch and traveling at a velocity of approximately 2.0 to 4.0 mm/second. The molding compound is injected into the mold cavity through a gate at least 2 mm in width by at least 0.30 mm in height or depth located on the same side of the leadframe as the device and electrical connections. The molding compound is then allowed to harden to encapsulate the device and the encapsulated product is removed from the mold. The external leads of the leadframe may then be trimmed and formed using conventional assembly techniques.

In order to preheat the molding compound, the transfer cam, also referred to as a plunger, is preheated to 195°±15° C. to preheat transfer pot and the molding compound is allowed to remain in the pot for between 2 and 12 seconds, preferably 3 seconds.

Transfer molding presses and separable molds for them are well known in the art and are commercially available from such sources as ASM Fico, Holland; Hull Corporation, Hatsboro, Pa.; J. D. Sprout, Calif. and KRAS Corporation, Hatsboro, Pa. Transfer mold presses generally utilized today allow the temperature of the mold halves and the temperature of the transfer ram to be controlled and preset. The mold presses also allow an operator to vary the velocity of the transfer ram that acts on the molding compound in the transfer pot to force the compound from the pot, through the runners, to the individual mold cavities. By controlling the temperature of the molding equipment and the velocity of the transfer ram, the velocity of the mold compound traveling through the mold and mold cavities may be controlled.

Mold compounds and lead frames suitable for use in the present invention are commercially available from a variety of sources. The type of lead frame utilized will depend on the semiconductor device being encapsulated and the number and configuration of leads desired in the encapsulated package.

The process of the present invention may be utilized to produce different plastic package types including PDIPs, PQFPs, SOJs, SOICs and PLCCs. As will be obvious to those of skill in the art, the type of package produced, and its dimensions, depends on the shape of the mold cavity.

The process of the present invention may be utilized to encapsulate a variety of integrated circuit wafers including logic devices and memory devices.

The process of the present invention advantageously produces same-side gated products without wire sweep or voids.

Other details and advantages of the process of the present invention will become apparent from the following more detailed description.

DETAILED DESCRIPTION OF THE INVENTION

Figure 1:
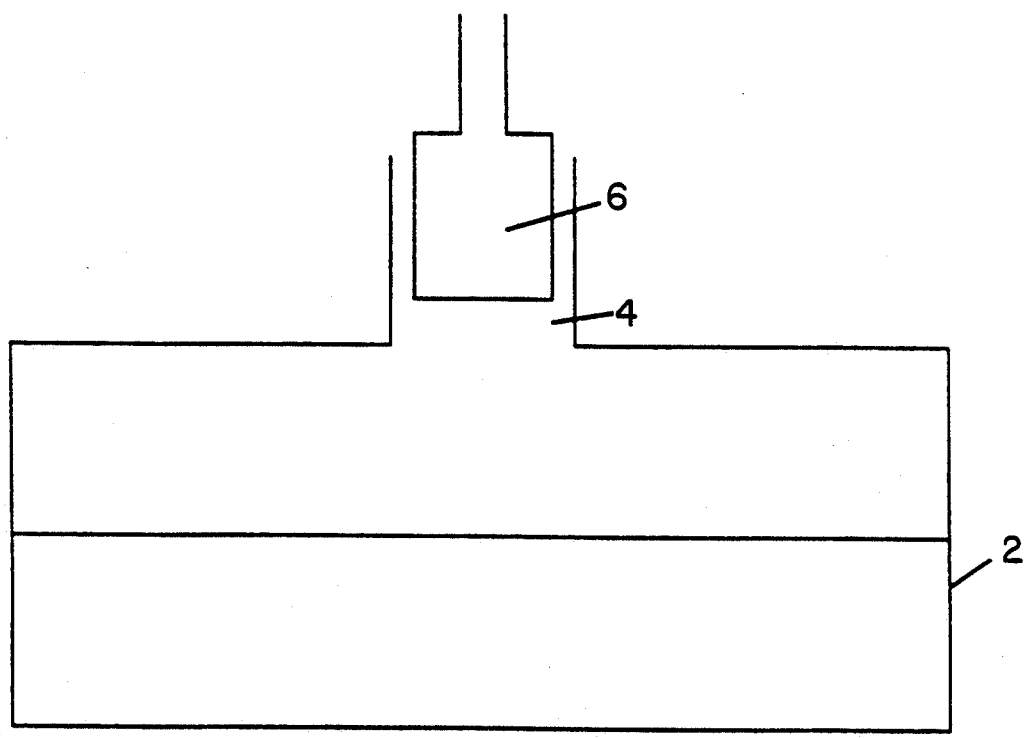
FIG. 1 shows a cross sectional view of a section of a transfer mold press that may be utilized in the process of the present invention.

The process of the present invention is a process for encapsulating a semiconductor device, such as an integrated circuit, in a transfer mold press containing a separable two part mold having a transfer pot, a plurality of mold cavities, and a plurality of runners and gates connecting the transfer pot to the mold cavities and containing a transfer ram disposed in the transfer pot to force mold compound placed in the transfer pot from the pot through the runners and gates into the individual mold cavities. The process comprises:

heating each half of the mold to 188°±3° C.;
attaching the semiconductor device to the central portion of a leadframe;
making electrical connections, with a loop height of less than 12 mils, between electrical terminals on the semiconductor device and the leads of the leadframe;
placing the leadframe in a first half of the mold with the attached device and electrical connections disposed over a half cavity in the first mold half;
securing the second half of the mold over the leadframe with the attached device and electrical connections disposed in a half cavity in the second mold half to thereby position the attached device and electrical connections in a mold cavity formed from the cavities in the first and second mold halves;
heating the transfer ram to 195°±15° C.;
placing a solid thermosetting mold compound in the transfer pot and heating the mold compound for between 2 and 12 seconds, preferably for 3 seconds;
contacting heated mold compound in the transfer pot with the transfer ram at a velocity of 2.0 to 4.0 mm/second to exert a pressure of between 950 and 1050 pounds per square inch on the heated mold compound to fluidize the mold compound and force the compound from the transfer pot through the runners to a gate having a width of at least 2 mm and a height of at least 0.30 mm, in communication with the mold cavity, and located on the same side of the mold cavity as the attached device and electrical connections, to thereby inject the mold compound into the mold cavity;
allowing the mold compound to completely fill the mold cavity and harden to encapsulate the device.

Preferably, leadframe is preheated to 188°±10° C., the mold is heated to 188° C., the transfer ram is heated to 195° C., the mold compound is heated in the transfer pot for 3 seconds and the pressure exerted by the transfer ram is 1000 pounds per square inch. The pressure exerted by the transfer ram and its velocity, and the temperature of the mold compound and mold allow the velocity of the mold compound flowing through the mold to be controlled. Preferably, the velocity of the mold compound is maintained at between 2.0 and 4.0 mm/sec.

After the device is encapsulated the leadframe may be removed from the mold and subjected to conventional trim and form assembly operations to produce a same-side gated plastic encapsulated integrated circuit product.

The process of the present invention will be explained in more detail in the following paragraphs with reference to the attached figures.

FIG. 1 depicts a section of a typical mold press 2, showing transfer pot 4 and transfer ram 6. As shown in FIG. 1, the transfer pot is generally a cylinder and the transfer ram is generally a piston or plunger slidably mounted in the transfer pot. Movement of the transfer ram into the transfer pot will force material out of the transfer pot under pressure. The mold press is generally connected to a hydraulic system to allow precise control of the pressure exerted by the transfer ram on materials in the transfer pot and the velocity of the transfer ram.

Figure 2:
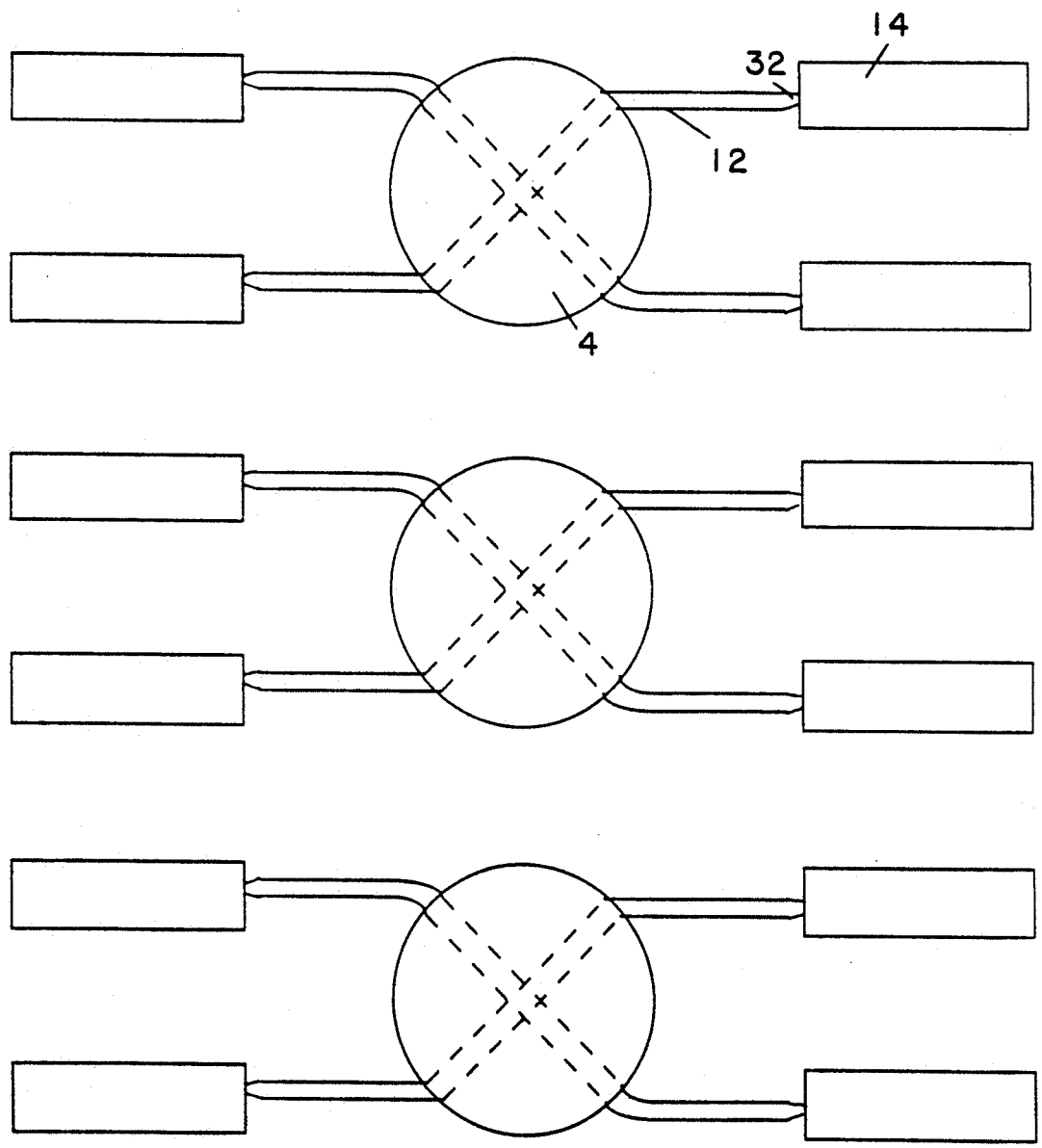
FIG. 2 shows a view of a section of half of a typical transfer mold.

FIG. 2 shows a representation of a portion of a half 10, of a two part separable mold. As shown in FIG. 2, sets of runners 12, connect transfer pot 4 with the individual mold cavities 14 providing a path to allow mold compound to be transferred from the transfer pot to the individual cavities.

Figure 3:
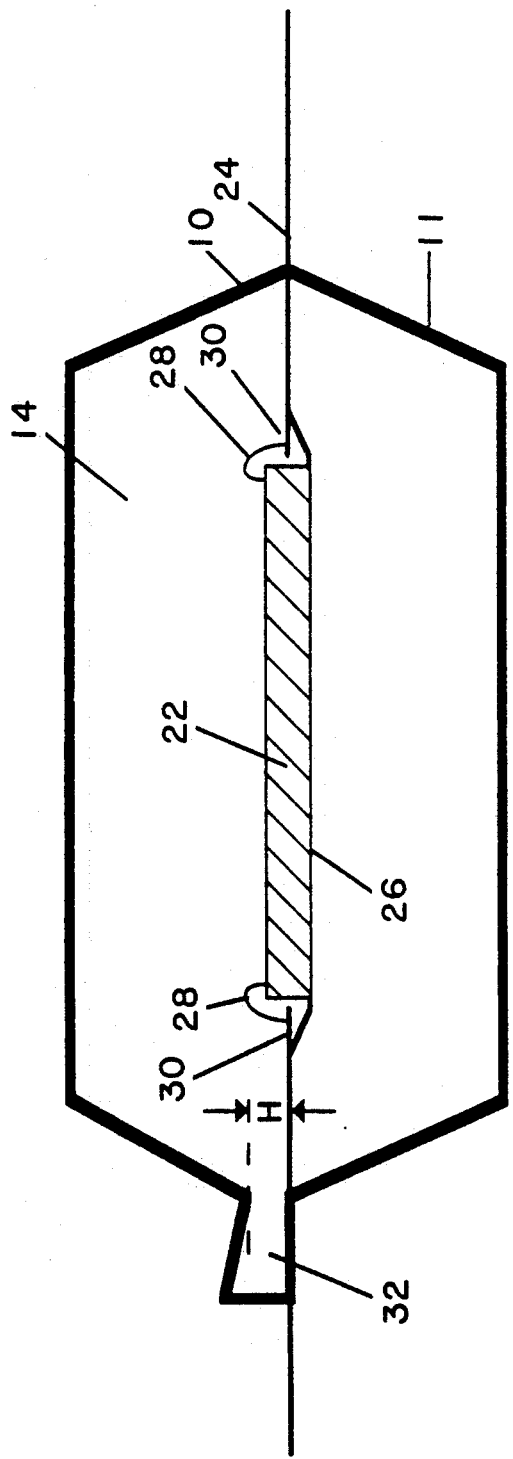
FIG. 3 shows a view of the interior of a mold cavity containing a semiconductor device, electrical connections and leadframe.

FIG. 3 shows a view of the inside of a mold cavity, 14 formed by mold halves 10 and 11. The runners leading up to the cavity are not shown. FIG. 3 depicts semiconductor device 22 mounted on the die pad portion 26, of a portion of a leadframe 24. Electrical connections 28 run from electrical terminals on the semiconductor device to lead tips 30 of the leadframe 24. As shown in FIG. 3, in the process of the present invention the semiconductor device and electrical connections are generally positioned in the central region of a mold cavity. Gate 32 is located on the same side of the leadframe 24, as device 22 and electrical connections 28. The height of gate 32 at the entrance to the mold cavity is shown in FIG. 3 as H. In the process of the present invention H is at least 0.30 mm and may be as great as 0.50 mm. The width of the gate at the entrance to the mold cavity is at least 2 mm and preferably 2 mm. The choice of particular gate size within these limits depends on the device being encapsulated and the package type desired and is within the skill of one of ordinary skill in the art of transfer molding.

FIG. 3 shows the same-side gated process of the present invention wherein the gate is located in mold half 10, which in the figure is the top mold half. In order to transfer mold according to the process of the present invention with this gate configuration, the device and electrical connections are placed in the mold facing up. However, the process of the present invention is not limited to this configuration. The process of the present invention is equally well suited for use in a mold wherein the gate is located in the bottom mold half and the device and electrical connections are facing down.

Figure 4:
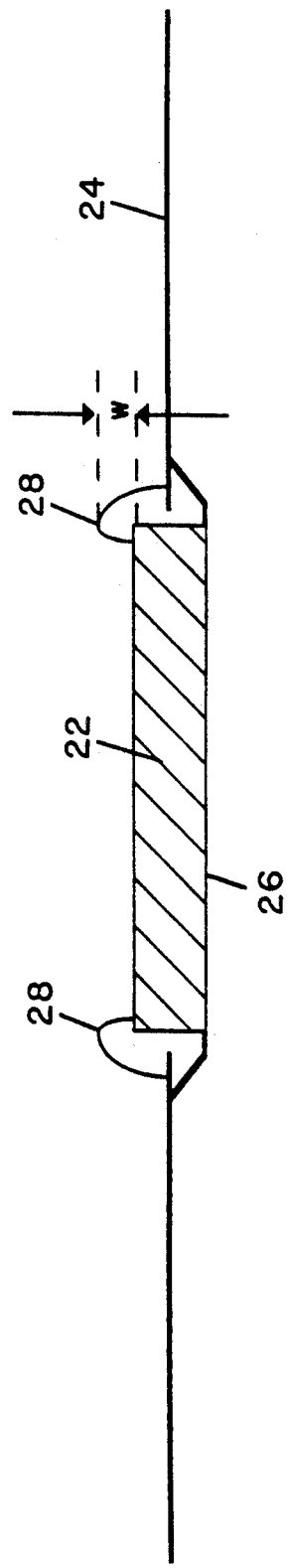
FIG. 4 shows a view of a portion of a leadframe with a mounted semiconductor device and electrical connections.

FIG. 4 is an enlarged view of the portion of leadframe 24 with attached device 22 and electrical connections 28. Die pad 26 is shown as slightly offset or depressed from the remainder of the leadframe. Those of ordinary skill in the art are well acquainted with the use and advantages of leadframes with depressed die pads. The loop height of the electrical connections, also referred to as the wire bond height is shown as "w" in FIG. 4. The loop height is defined as the distance from the peak of the wire loop to the semiconductor surface. As set forth above, in the process of the present invention, w is not greater than 12 mils (thousandths of an inch). Preferably, w is between 8 and 10 mils.

Today, most, if not all, electrical connections between a semiconductor device and a lead frame are made utilizing an automated wire bonding machine. Extremely fine gold wire, generally between 1 and 2 mils in diameter is loaded into the wire bonding machine and automatically soldered or welded to specific points on the semiconductor device and the leadframe tips. This fine gold wire is often referred to as bond wire or whisker wire. Loop height is generally determined by the settings on the wire bonding machine as well as the distance between the top of the semiconductor device and the lead tips. Loop height can be reduced by depressing the die pad portion of the lead frame, which will reduce the height of the device above the leadframe tips.

Methods for attaching the semiconductor device to a leadframe are well known in the art. Generally the device is "glued" to the die pad portion of the leadframe using an epoxy. There are many commercially available die attach compounds suitable in the process of the present invention including: Ablestik 84-1LMI-SR3, manufactured and sold by Ablestik Laboratories, Rancho Dominguez, Calif.; and EPOTEK H20E manufactured and sold by Epoxy Technology, Inc., Billerica, Mass. Preferably the die attach compound utilized is Ablestik 84-1LMI-SR3.

In order to load the leadframe or leadframes, with attached die and electrical connections into the mold an automated device, generally referred to as a turntable, may be utilized. Leadframes with attached die and electrical connections are loaded into the turntable. In order to preheat the leadframe, the turntable may be maintained at a relatively constant heated temperature. Commercially available turntables generally have temperature controls and internal heating elements to perform this function. For transfer molding the leadframes are automatically loaded into, and positioned in the mold, by the turntable device, with each die positioned over a mold cavity.

The process of the present invention may be performed with commercially available molding compounds. These compounds include, but are not limited to: Sumitomo EME6300H/HR, manufactured and sold by Sumitomo, South San Francisco, Calif. and Hysol MG65, manufactured and sold by Tenax Co., Danbury Conn. Preferably the molding compound utilized is Sumitomo EME6300H/HR. The properties of the molding compound utilized should be such that at the preheat temperatures and transfer ram pressures utilized in the process of the present invention, the mold compound flows through the mold and mold cavities without producing wire sweep or voids.

The process of the present invention may advantageously be utilized to produce same-side gated plastic encapsulated integrated circuits products without wire sweep problems or voids.

The process of the present invention also advantageously produces same-side gated plastic encapsulated integrated circuit products without substantial flash.

As will be recognized by those of ordinary skill in the art, the exact numerical parameters of the process, and the equipment settings, will vary depending on the mold equipment and molding compounds utilized. We have discovered the importance of the process parameters and equipment settings set forth herein, to successfully encapsulate semiconductor devices utilizing a same-side gated process. The fine tuning of these process parameters and equipment settings in order to successfully encapsulate semiconductor devices utilizing the same-side gated process of the present invention in different molding equipment, with the same or different molding compounds etc., is within the skill of those of ordinary skill in the art and falls within the scope of the present invention.

EXAMPLE

Figure 5C:
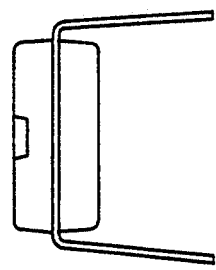
FIGS. 5a, 5b, and 5c, referred to in Example 1, shows a PDIP package type plastic encapsulated semiconductor device.
Figure 5A:
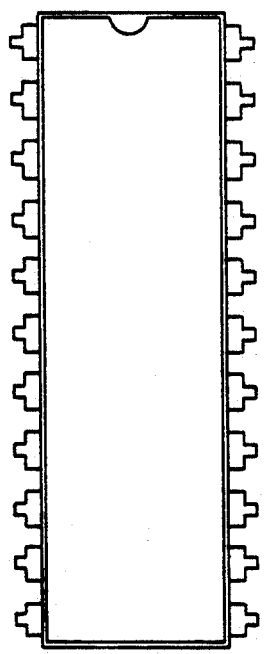
Figure 5B:
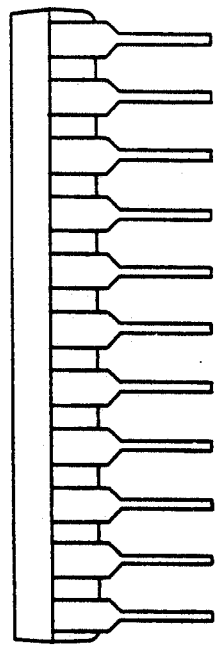

This example illustrates the use of the process of the present invention to encapsulate a semiconductor wafer in plastic to produce a 300 mil wide, 22 lead PDIP package such as depicted in FIGS. 5a, 5b and 5c.

The semiconductor wafers are mounted on a suitable leadframe in a conventional manner using Abelstik die attach adhesive. Wire bonds are made from terminals on the wafers to the lead tips of the leadframe using 1.3 mil gold bond wire. The wire bonding is performed by a Shinkawa UTC50 automated wire bonder. The wire bonder is set so that the wire loop height is 10 mils.

After wire bonding the leadframe is placed in a turntable device that will automatically load the leadframes in the mold press. The turntable device has been preheated to approximately 188° C. by setting the appropriate temperature controls on the device.

The turntable places the leadframe in the lower chase of a ASM-Fico AMS140 Automold that has been preheated to 188° C. by setting the appropriate temperature controls. The leadframe is placed in the lower chase with the semiconductor device and accompanying bond wires facing down. The guidepins of the mold chase are utilized to position the leadframe in the mold so that each device and accompanying bond wires are located in a mold cavity.

The upper chase of the mold, which has also been preheated to 188° C. by setting the appropriate temperature controls, is closed to secure the leadframe in the mold. The clamp pressure is set to 1400 pounds per square inch.

The closing of the mold halves completes the formation of a series of runners leading from a central transfer pot to each individual mold cavity. The gate leading into each mold cavity is located in the lower chase of the mold on the same side of the mold cavity as the semiconductor device and bond wires.

The transfer pot of the mold is preheated by setting the temperature control on the transfer plunger to 195° C. The appropriate number of pellets of Sumitomo EME6300H/HR molding compound are placed in the transfer pot of the mold and allowed to sit for approximately 3 seconds. The transfer speed of the transfer plunger is set for approximately 3.3 seconds and the plunger is started, forcing the molding compound out of the transfer pot through the runners. The mold compound continues through the runners and then into each mold cavity through a gate located in the lower half of the mold cavity. Thus, the molding compound enters each mold cavity on the same side of the leadframe as the semiconductor device and bond wires.

The molding compound is allowed to cure in the cavities for approximately 34 seconds. Then the mold is open and the leadframe is removed. The leadframe then undergoes conventional trim and form operations to produce the package depicted in FIGS. 5a, 5b and 5c.

We claim:

1. A process for encapsulating a semiconductor device attached to a leadframe with electrical connections between the device and the lead frame and positioned in a mold cavity in a transfer mold press containing a separable two part mold having a transfer pot containing a transfer ram, a plurality of mold cavities, a plurality of runners connecting the mold cavities to the transfer pot and a gate to each mold cavity, located in the same half of each mold cavity as the device, comprising:
   placing an encapsulating plastic in the transfer pot and forcing the encapsulating plastic from the transfer pot, through the runners and a gate into a mold cavity and allowing the encapsulating plastic to completely fill the mold cavity and harden to encapsulate the device,
   wherein:
   the gate through which the encapsulating plastic is injected into the mold cavity containing the device is located in the same half of the mold cavity as the device and is at least 2 mm in width by at least 0.30 mm in height or depth;
   the velocity of encapsulating plastic moving through the mold is between 2.0 and 4.0 mm/sec.;
   and the loop height of the electrical connections between the device and the leadframe is less than 12 mils.

2. The process of claim 1 wherein the velocity of the encapsulating plastic is controlled by controlling the temperature of the lead frame, the mold half, the transfer ram, the transfer pot and the encapsulating plastic and by controlling the pressure and velocity of the transfer ram as it forces the encapsulating plastic from the transfer pot through the runners and gates and into the mold cavities.

3. The process of claim 2 further comprising: removing the leadframe from the mold after the mold compound hardens and trimming and forming the external leads of the leadframe to produce a same-side gated, encapsulated integrated circuit device.

4. The process of claim 3 wherein the same-side gated, encapsulating integrated circuit device is selected from the group consisting of: a PDIP, a PQFP, a PLCC an SOIC and a SOJ.

5. A process for encapsulating an integrated circuit device in a transfer mold press containing a preheated separable two part mold having a transfer pot, a plurality of mold cavities, and a plurality of runners and gates connecting the transfer pot to the mold cavities and containing a transfer ram disposed in the transfer pot, wherein each gate is configured to be in the same mold part as the integrated circuit device, the process comprising:
   attaching the integrated circuit device to the central portion of a leadframe;
   making electrical connections, with a loop height of less than 12 mils, between electrical terminals on the integrated circuit device and the leads of the leadframe;
   preheat leadframe to 188°±15° C.;
   placing the leadframe in a first half of the mold with the attached device and electrical connections disposed over a mold cavity;
   securing the second half of the mold over the leadframe;
   placing a solid thermosetting mold compound in a preheated transfer pot;
   contacting heated mold compound in the transfer pot with the transfer ram to exert a pressure of between 950 and 1050 pounds per square inch on the heated mold compound and force the compound from the transfer pot through the runners to a gate located on the same side of the mold cavity as the attached device and electrical connections, to thereby inject the mold compound into the mold cavity at a speed of 2 to 4 mm/sec;
   allowing the mold compound to completely fill the mold cavity and harden to encapsulate the device;
   wherein the gate has a width of at least 2 mm and a height of at least 0.30 mm.

6. The process of claim 5 wherein the mold compound is heated for 3 seconds in the transfer pot.

7. The process of claim 5 wherein the mold is heated to a temperature of 188° C.

8. The process of claim 5 further comprising: removing the leadframe from the mold after the mold compound hardens and trimming and forming the external leads of the leadframe to produce a same-side gated, encapsulated integrated circuit device.

9. The process of claim 8 wherein the same-side gated, encapsulated integrated circuit device is selected from the group consisting of: a PDIP, a PQFP, a PLCC an SOIC and a SOJ.

* * * * *